US009160961B2

(12) United States Patent
Kawasaki et al.

(10) Patent No.: US 9,160,961 B2
(45) Date of Patent: Oct. 13, 2015

(54) TELEVISION RECEIVER AND ELECTRONIC APPARATUS

(71) Applicant: Kabushiki Kaisha Toshiba, Tokyo (JP)

(72) Inventors: Hirokazu Kawasaki, Tokyo (JP); Minoru Enomoto, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 399 days.

(21) Appl. No.: 13/676,994

(22) Filed: Nov. 14, 2012

(65) Prior Publication Data
US 2013/0176510 A1 Jul. 11, 2013

(30) Foreign Application Priority Data
Jan. 6, 2012 (JP) .................................. 2012-001678

(51) Int. Cl.
H04N 5/64 (2006.01)
H04N 5/655 (2006.01)
H05K 5/03 (2006.01)

(52) U.S. Cl.
CPC . *H04N 5/655* (2013.01); *H05K 5/03* (2013.01)

(58) Field of Classification Search
USPC ......... 348/841, 836, 729, 725, 723, 706, 597, 348/596, 656, 661, 563, 569, 333.02; 361/679.01, 679.09, 681, 683, 679.02, 361/679.07, 679.21, 679.27; 359/450, 511, 359/277, 369, 400, 449, 847
See application file for complete search history.

(56) References Cited

U.S. PATENT DOCUMENTS

| 6,783,232 | B2 | 8/2004 | Takahashi et al. |
| 7,703,043 | B2 * | 4/2010 | Utsuki et al. .................. 715/830 |
| 2002/0057484 | A1 * | 5/2002 | Mori .............................. 359/291 |
| 2003/0020797 | A1 | 1/2003 | Takahashi et al. |
| 2003/0041961 | A1 * | 3/2003 | Thunhorst et al. ............. 156/247 |
| 2006/0196268 | A1 * | 9/2006 | Sakamoto ................... 73/504.14 |
| 2007/0115202 | A1 * | 5/2007 | Kiesenhofer ................. 345/1.1 |
| 2007/0293005 | A1 * | 12/2007 | Shigenobu et al. ........... 438/238 |
| 2008/0007904 | A1 * | 1/2008 | Chen et al. .................... 361/681 |

(Continued)

FOREIGN PATENT DOCUMENTS

| JP | 3053974 U | 9/1998 |
| JP | 2000-105538 A | 4/2000 |

(Continued)

OTHER PUBLICATIONS

Notice of Rejection mailed by Japan Patent Office on Feb. 5, 2013 in the corresponding Japanese patent application No. 2012-001678.

(Continued)

*Primary Examiner* — Jefferey Harold
*Assistant Examiner* — Mustafizur Rahman
(74) *Attorney, Agent, or Firm* — Knobbe, Martens, Olson & Bear LLP

(57) ABSTRACT

According to one embodiment, an electronic apparatus includes: a display comprising a screen; a first member configured to cover at least a side opposite to the screen of the display; a second member configured to be positioned closer to the screen than the first member and to cover at least a peripheral edge of the display; and supports comprising protruding portions, respectively, the protruding portions protruding from positions closer to a center portion than both ends in a longitudinal direction of the screen on an end in a lateral direction of the screen of the second member.

9 Claims, 13 Drawing Sheets

(56) References Cited

U.S. PATENT DOCUMENTS

| | | |
|---|---|---|
| 2009/0031596 A1* | 2/2009 | Prpich .................. 40/124.06 |
| 2009/0225257 A1* | 9/2009 | Sugiyama et al. ............. 349/96 |
| 2010/0021200 A1* | 1/2010 | Kato ........................ 399/111 |
| 2011/0026752 A1* | 2/2011 | Yao et al. .................. 381/355 |
| 2011/0187731 A1* | 8/2011 | Tsuchida ................... 345/581 |
| 2011/0304908 A1* | 12/2011 | Giammarinaro, Jr. ........ 359/450 |

FOREIGN PATENT DOCUMENTS

| | | |
|---|---|---|
| JP | 2002-044568 A | 2/2002 |
| JP | 2003-039774 A | 2/2003 |
| JP | 2004-317855 A | 11/2004 |
| JP | 2009-015390 A | 1/2009 |
| JP | 2010-062246 A | 3/2010 |
| JP | 2011-211421 A | 10/2011 |

OTHER PUBLICATIONS

Notice of Rejection mailed by Japan Patent Office on Apr. 30, 2013 in the corresponding Japanese patent application No. 2012-001678.

* cited by examiner

TELEVISION RECEIVER AND ELECTRONIC APPARATUS

CROSS-REFERENCE TO RELATED APPLICATIONS

This application is based upon and claims the benefit of priority from Japanese Patent Application No. 2012-001678, filed on Jan. 6, 2012, the entire contents of which are incorporated herein by reference.

FIELD

Embodiments described herein relate generally to a television receiver and an electronic apparatus.

BACKGROUND

Conventionally widely known are television receivers in which a housing that houses a display is supported by a support.

Such television receivers may be desired to be capable of being placed in a smaller space.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
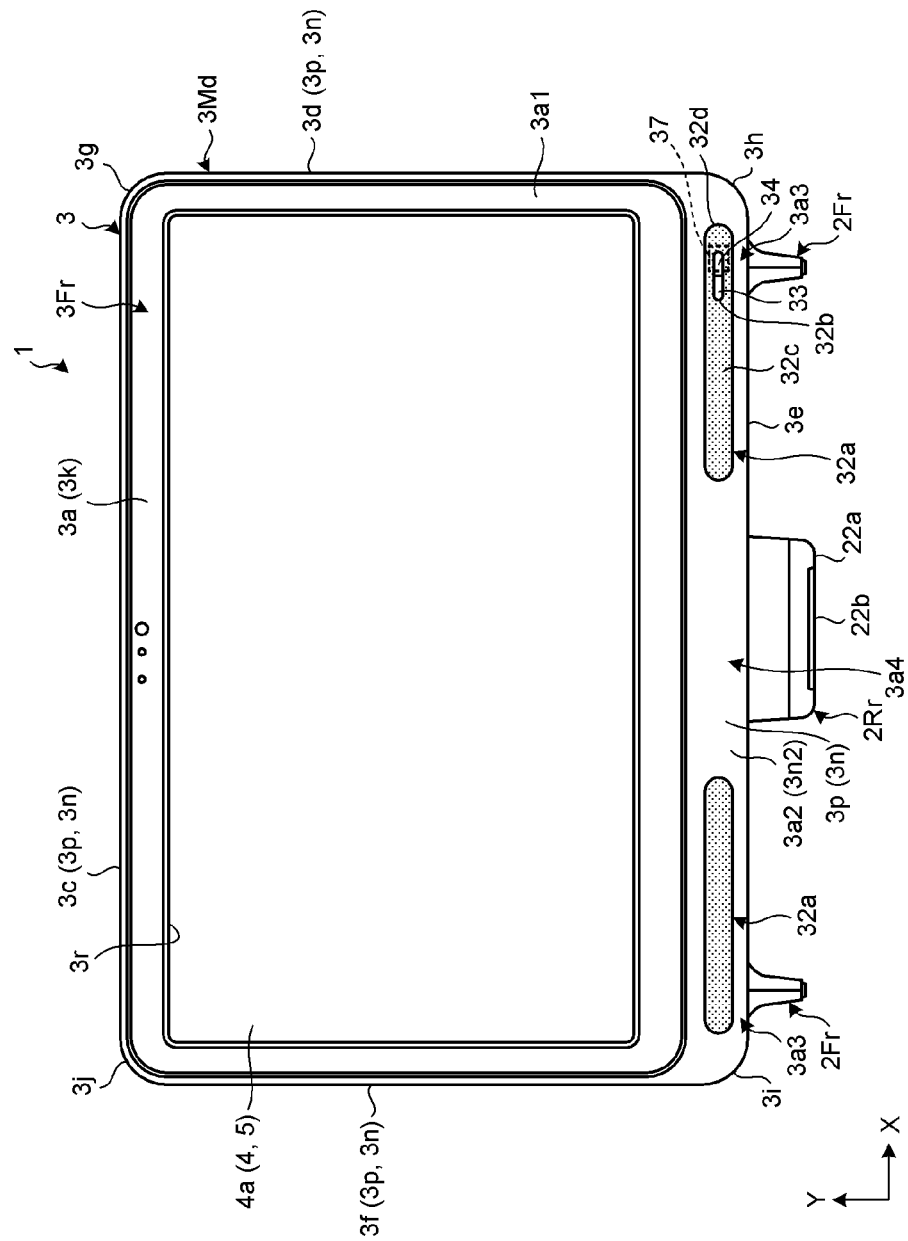
FIG. 1 is an exemplary front view of a television receiver according to a first embodiment.
Figure 2:
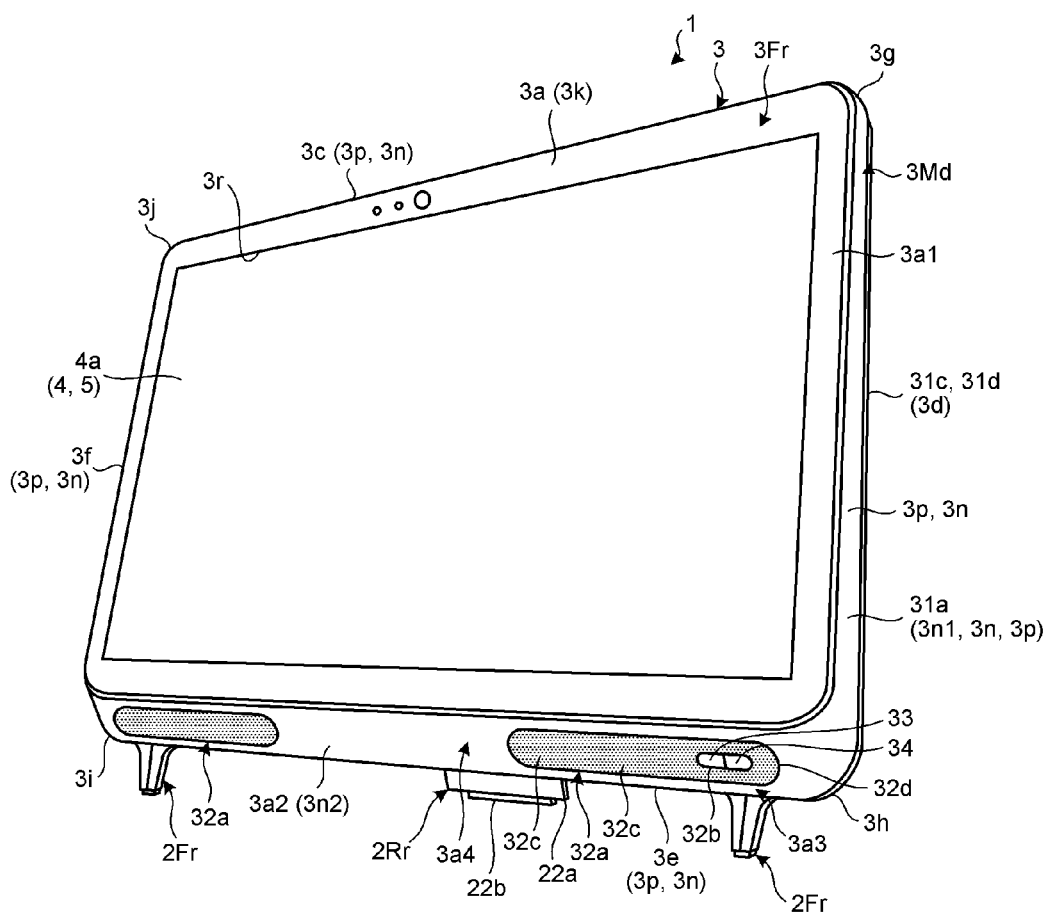
FIG. 2 is an exemplary perspective view of the television receiver in the embodiment viewed from the front.

In general, according to one embodiment, a television receiver comprises: a display comprising a screen; a cover configured to cover at least a side opposite to the screen of the display; a mask configured to cover a periphery of the screen from a side opposite to the cover; a middle frame configured to have higher rigidity than that of the mask and have a larger outer edge than that of the mask, and to be positioned between the mask and the cover to cover at least a peripheral edge of the display, and to which a housed component is attached; two first supports comprising first protruding portions, respectively, the first protruding portions configured to be provided integrally with the middle frame and to protrude from positions closer to a center portion than both ends in a longitudinal direction of the screen on an end in a lateral direction of the screen; and a second support configured to protrude from the cover and to be arranged separately from the two first supports.

Exemplary embodiments and modifications described below comprise components similar to each other. Therefore, in the description below, common reference numerals are assigned to similar components, and overlapping explanation thereof will be omitted. Furthermore, in the drawings, directions (an X direction, a Y direction, and a Z direction) are illustrated for convenience. The X direction is a longitudinal direction with respect to a screen 4a viewed from the front, the Y direction is a lateral direction with respect to the screen 4a viewed from the front, and the Z direction is a front-back direction (a depth direction or a thickness direction of a housing 3) with respect to the screen 4a viewed from the front. The X direction, the Y direction, and the Z direction are orthogonal to one another.

In the embodiments below, an electronic apparatus is embodied as a television receiver or a personal computer, for example. However, the electronic apparatus according to the present embodiment is not limited thereto. The electronic apparatus according to the present embodiment can be embodied as various types of electronic apparatuses, such as a smartphone, a smartbook, a mobile phone, a personal digital assistant (PDA), a video display, and a video phone.

First Embodiment

A television receiver 1 that is an example of an electronic apparatus according to a first embodiment comprises supports 2Fr and 2Rr (stand parts, bases, or stands) and the housing 3 as illustrated in FIGS. 1 to 5. The supports 2Fr and 2Rr are placed on a placing section (not illustrated), such as a desk, a shelf, and a rest, and support the housing 3.

As illustrated in FIG. 1, the housing 3 is formed in a square shape (a rectangular shape in the first embodiment, for example) viewed from the front. Furthermore, as illustrated in FIGS. 1 to 5, the housing 3 is formed in a flat rectangular parallelepiped shape that has a small width in the front-back direction. The housing 3 comprises a front surface 3a (a front face, a surface, a surface portion, or a front surface portion) and a rear surface 3b (a back surface, a surface, a surface portion, or a rear surface portion) opposite to the front surface 3a. The front surface 3a is an example of a first front surface. Furthermore, as illustrated in FIG. 1, the housing 3 comprises four ends 3c to 3f (sides or edges) and four corners 3g to 3j (peaks, curves, or ends) viewed from the front. The ends 3c and 3e are both ends in the lateral direction of the housing 3 and a display 4, and are examples of a long side. The ends 3d and 3f are both ends in the longitudinal direction of the housing 3 and the display 4, and are examples of a short side. The housing 3 is supported by the supports 2Fr and 2Rr in a standing manner (position).

The housing 3 further comprises a wall 3k (a portion, a plate, a frame, a bezel, a front wall, a face wall, or a top wall) comprising a front surface 3a1 and a wall 3m (a portion, a plate, a rear wall, a back wall, or a bottom wall) comprising the rear surface 3b. The front surface 3a1 serves as a part of the front surface 3a of the housing 3, and is approximately parallel to the rear surface 3b. The walls 3k and 3m are in a square shape (a rectangular shape in the first embodiment, for example). Furthermore, the housing 3 comprises four walls 3n (portions, plates, side walls, end walls, standing walls, or extending portions) comprising an extending surface 3p (a peripheral surface, a surface, or a surface portion) extending between the wall 3k and the wall 3m. At least a part of the extending surface 3p serves as a side surface of the housing 3. The wall 3k has an opening 3r in a square shape (a rectangular shape in the first embodiment, for example). In other words, the front surface 3a has the opening 3r. The opening 3r is an example of a first opening.

Furthermore, the housing 3 can be configured by combining a plurality of components (divided parts or members). The housing 3, for example, comprises a first member 3Rr (a first portion, a rear side member, a base, a bottom, a back cover, or a cover) including at least the wall 3m, a second member 3Md (a second portion, a middle member, a frame, a middle frame, a middle cover, or a middle frame) including at least the wall 3n, and a third member 3Fr (a third portion, a front side member, a bezel, a front cover, and a mask) including at least the wall 3k. The housing 3 can be made of a synthetic resin material and a metal material, for example. The second member 3Md has higher rigidity than that of the third member 3Fr, and has a larger outer edge than that of the third member 3Fr.

In the first embodiment, for example, the wall 3k of the third member 3Fr is formed in a square (e.g., rectangular) frame and plate shape, and covers a peripheral edge of the display 4 as illustrated in FIG. 1. The housing 3 houses the display 4 (a display module, a display, or a panel). The screen 4a of the display 4 arranged on the front surface 3a side is exposed forward (outside) of the housing 3 through the opening 3r. A user can visually confirm the screen 4a from the front side through the opening 3r. In other words, the screen 4a of the display 4 is exposed by the opening 3r. The display 4 is formed in a square shape (a rectangular shape in the first embodiment, for example) viewed from the front. Furthermore, the display 4 is formed in a flat rectangular parallelepiped shape that has a small width in the front-back direction. The display 4 is a liquid crystal display (LCD) or an organic electro-luminescent display (OELD), for example. Furthermore, in the first embodiment, the display 4 is attached to the second member 3Md, for example. To attach the display 4 to the second member 3Md, for example, a fixture (e.g., a screw) and a bracket (a metal fitting) can be used (neither of which is illustrated).

Furthermore, the front side (face side or wall 3k side) of the display 4 is provided with an input operation panel 5 (e.g., a touch panel, a touch sensor, and an operation surface) that is transparent and is formed in a relatively thin square shape (a rectangular shape in the first embodiment, for example). The input operation panel 5 covers the screen 4a. An operator (e.g., a user) uses his/her finger or a stylus to perform an operation, such as a touch, a press, a slide, and a motion of the finger or the stylus in the vicinity of the input operation panel 5, with respect to the input operation panel 5, thereby performing input processing, for example. Furthermore, light output from the screen 4a of the display 4 passes through the input operation panel 5, and is output forward (outside) of the housing 3 through the opening 3r of the wall 3k. The input operation panel 5 is an example of an input module.

In the first embodiment, for example, the second member 3Md surrounds the third member 3Fr as illustrated in FIG. 1. At least within a range seen from the front, the third member 3Fr and the second member 3Md are different from each other in colors, degrees of luster, surface texture, smoothness, and surface roughness, for example. These differences in appearance facilitate discriminating the third member 3Fr from the second member 3Md. Furthermore, on the upper (upper) end 3c and the side (both left and right) ends 3d and 3f, the width of the second member 3Md is smaller than that of the third member 3Fr viewed from the front.

Figure 4:
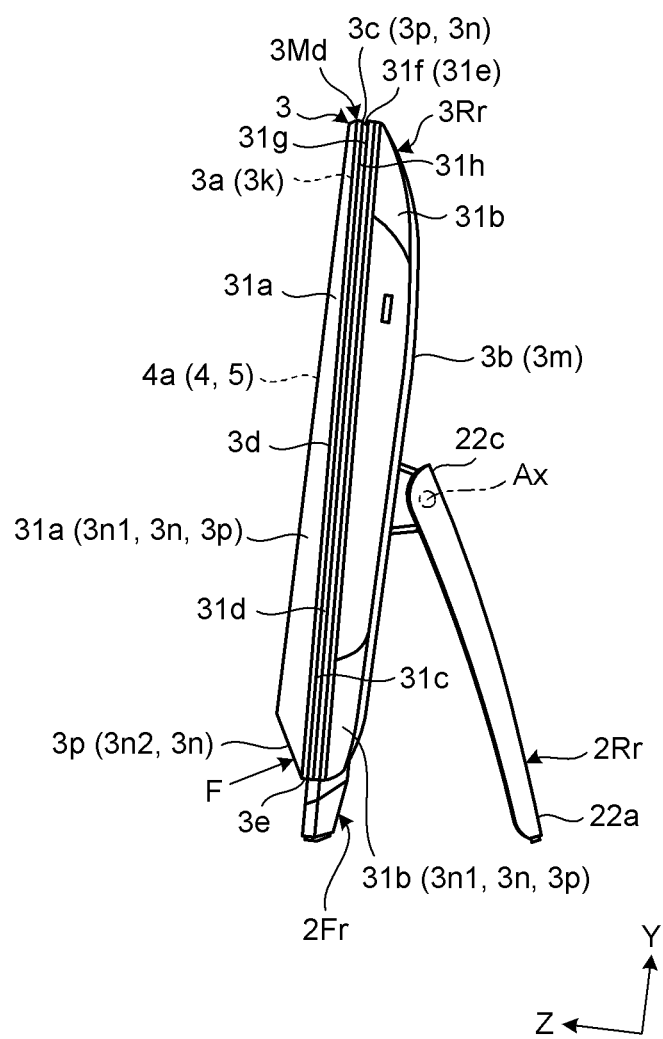
FIG. 4 is an exemplary side view of the television receiver in the embodiment, and illustrates a state in which a support is unfolded.
Figure 5:
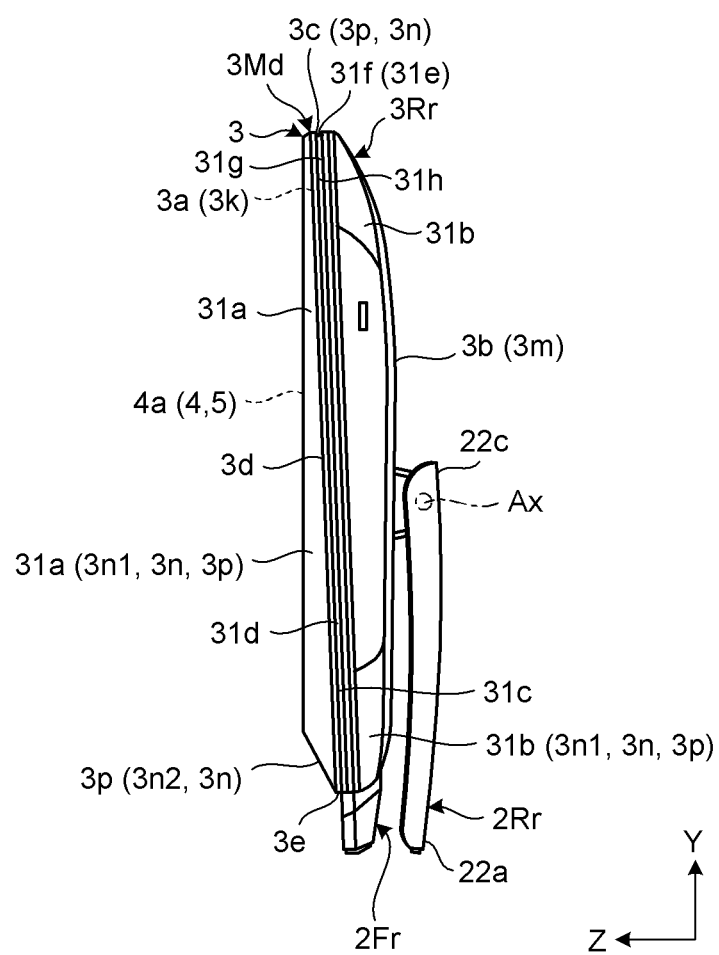
FIG. 5 is an exemplary side view of the television receiver in the embodiment, and illustrates a state in which the support is folded.
Figure 6:
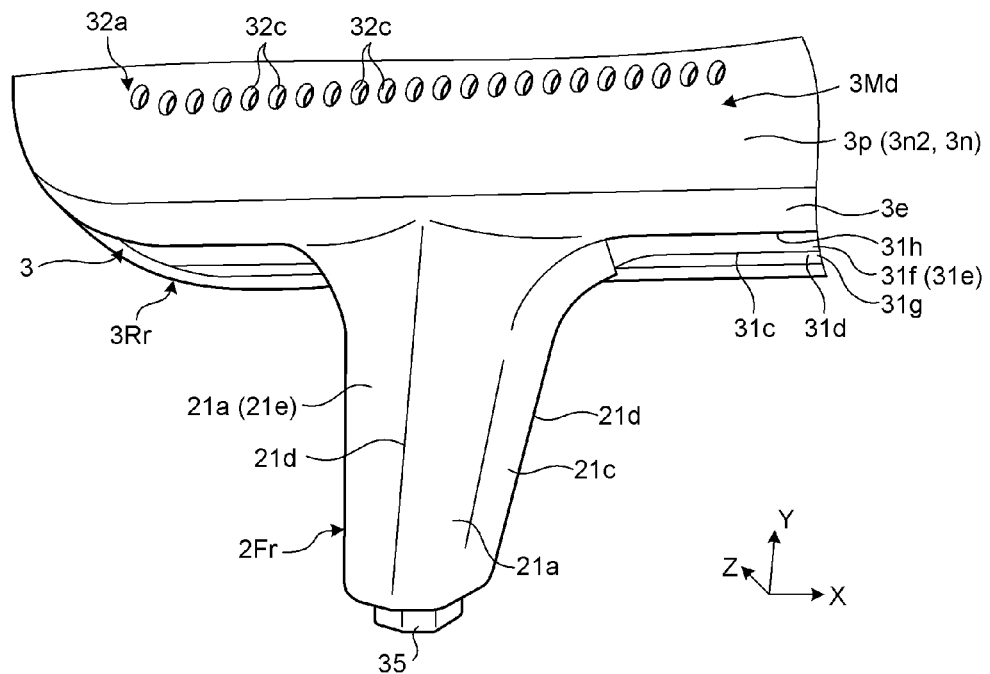
FIG. 6 is an exemplary perspective view of a part including a first support of the television receiver in the embodiment viewed from the front.
Figure 7:
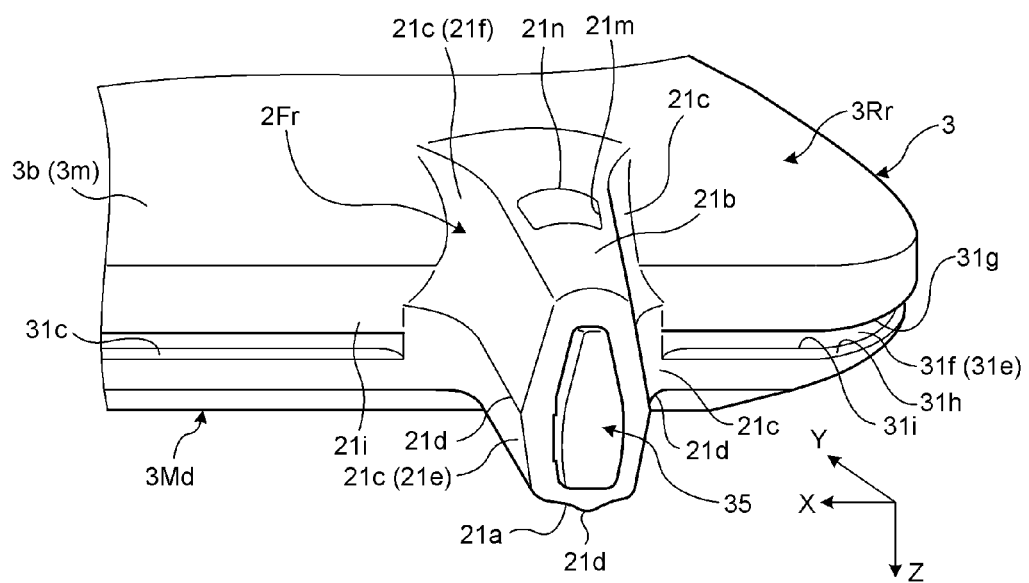
FIG. 7 is an exemplary perspective view of a part including the first support of the television receiver in the embodiment viewed from the back and the bottom.

In the first embodiment, for example, a wall 3n1 (a side wall) positioned on both ends in the longitudinal direction of the display 4 among the walls 3n comprises a front portion 31a (a portion, an area, or a wall) included in the second member 3Md and a rear portion 31b (a portion, an area, or a wall) included in the first member 3Rr as illustrated in FIGS. 4 and 5. The front portion 31a is formed in a triangle shape that tapers (sharpens) upward. In other words, the width of the front portion 31a becomes narrower (smaller or thinner) gradually from the end 3e side (one end side or the lower side) to the end 3c side (the other end side or the upper side) opposite to the end 3e in the housing 3. An edge 31c of the front portion 31a on the side opposite to the screen 4a (the rear side or the right side in FIGS. 4 and 5) is formed in a linear shape. The rear portion 31b (second wall) extends toward the center portion viewed from the front of the screen 4a while extending from an edge 31d fitting to the edge 31c to the side opposite to the screen 4a (the rear side or from the left side to the right side in FIGS. 4 and 5). In the first embodiment, for example, the wall 3m of the housing 3 bulges (curves) in a convex shape toward the rear side. Portions (edges) positioned on both ends in the longitudinal direction of the wall 3m serve as the rear portions 31b of the wall 3n1.

In the first embodiment, for example, a wall 3n2 positioned on one end side (the lower end side) in the lateral direction of the display 4 among the walls 3n serves as a part of the second member 3Md as illustrated in FIGS. 1, 2, 4, and 5. At least a part of a portion of the extending surface 3p included in the wall 3n2 serves as a front surface 3a2 (surface) of the wall 3n2. The front surface 3a2 of the wall 3n2 is a part of the front surface 3a of the housing 3, and serves as the front surface 3a of the housing 3 together with the front surface 3a1 of the wall 3k. The wall 3n2 extends from a distant side (the lower side) to a close side (the upper side) viewed from the front with respect to the screen 4a while extending from the rear side (back surface side, back side, side opposite to the screen 4a, right side in FIGS. 4 and 5) to the front side (front face side, screen 4a side, left side in FIGS. 4 and 5). In other words, (the front surface 3a2 of) the wall 3n2 is inclined with respect to a direction along the screen 4a and a normal direction of the screen 4a. The front surface 3a2 is an example of an inclined surface inclined with respect to the screen 4a.

In the first embodiment, for example, the wall 3n has a groove 31e (a grove portion or a concave portion) as illustrated in FIGS. 4 to 7. The groove 31e extends along a boundary line 31*i* (a boundary portion or a boundary, refer to FIG. 7) between the first member 3Rr and the second member 3Md. The groove 31*e* comprises a bottom surface 31*f* (a bottom portion, a bottom, a surface, or a portion) and a pair of facing surfaces 31*g* and 31*h* extending from the bottom surface 31*f*. The bottom surface 31*f* and one of the pair of facing surfaces 31*g* are provided to the first member 3Rr. The other of the pair of facing surfaces 31*h* is provided to the second member 3Md. The boundary line 31*i* (FIG. 7) is positioned in the groove 31*e*. In the first embodiment, for example, the boundary line 31*i* is positioned on a boundary (a boundary portion) between the bottom surface 31*f* and the facing surface 31*g*.

In the first embodiment, for example, the first support 2Fr is provided to the end 3*e* (one end, a long side portion, or a lower side portion) of the housing 3 in the lateral direction of the screen 4*a*, and supports the housing 3 as illustrated in FIG. 1. More specifically, two first supports 2Fr are arranged in a manner distant from each other in the longitudinal direction of the screen 4*a*, and protrude from the end 3*e* (one end, the long side portion, or the lower side portion) of the housing 3 in the lateral direction of the screen 4*a* to support the housing 3. The two first supports 2Fr protrude downward (in a direction opposite to the end 3*c*) from positions each closer to the center portion than both ends (the corners 3*h* and 3*i*) in the longitudinal direction (X direction, longitudinal direction of the screen 4*a*, or horizontal direction) on the end 3*e* (one end, the long side portion, or the lower side portion) in the lateral direction (Y direction or lateral direction of the screen 4*a*) of the housing 3. In the first embodiment, for example, the second support 2Rr protrudes from the first member 3Rr in a manner separated from the two first supports 2Fr as illustrated in FIGS. 1 to 5. Furthermore, the second support 2Rr protrudes from a position between the two first supports 2Fr viewed from the front with respect to the screen 4*a*, and supports the housing 3 together with the two first supports 2Fr at three points.

In the first embodiment, for example, the first support 2Fr protrudes in a direction along the edge 31*c* of the front portion 31*a* on the side opposite to the screen 4*a* (rear side or right side in FIG. 4) as illustrated in FIG. 4.

In the first embodiment, for example, the first support 2Fr is formed in a tapered shape as illustrated in FIGS. 1 to 4, and 6. In other words, the first support 2Fr tapers from the base to the tip. Furthermore, in the first embodiment, for example, a front surface 21*a*, a rear surface 21*b*, and two side surfaces 21*c* of the first support 2Fr bulge in a convex shape outward as is clear from FIGS. 6 and 7. Furthermore, the center portions of the front surface 21*a* and the two side surfaces 21*c* are each provided with a ridge line 21*d* extending between the base and the tip of the first support 2Fr. The portion of the ridge line 21*d* protrudes with respect to other portions on the front surface 21*a* and the two side surfaces 21*c*. The front surface 21*a* is an example of a second front surface.

Figure 9:
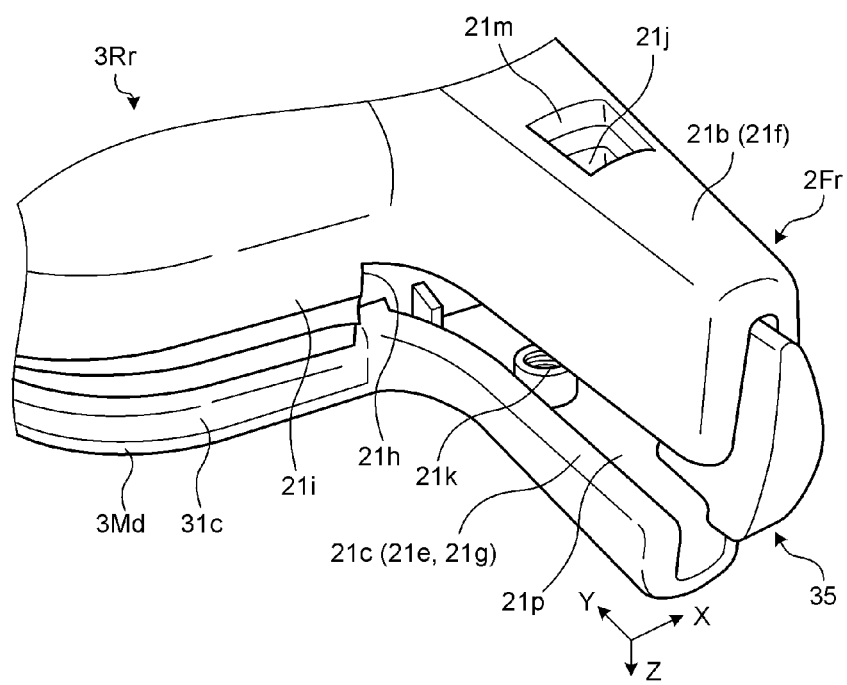
FIG. 9 is an exemplary exploded perspective view of a part including the first support of the television receiver in the embodiment viewed from the back and the bottom.

In the first embodiment, for example, the first support 2Fr comprises a first protruding portion 21*e* provided to the second member 3Md and a second protruding portion 21*f* provided to the first member 3Rr as illustrated in FIG. 9. Specifically, the first protruding portion 21*e* protrudes downward (toward the side opposite to the end 3*c*) from the end 3*e* of the second member 3Md, and protrudes rearward (toward the side opposite to the screen 4*a*) with respect to the edge 31*c*. The first protruding portion 21*e* comprises a first portion 21*g* positioned on the side opposite to the screen 4*a* (rear side) with respect to the edge 31*c*. The second protruding portion 21*f* protrudes downward along the first protruding portion 21*e* from the wall 3*m* (rear wall) and the wall 3*n* (side wall) of the first member 3Rr. The first member 3Rr has a slit 21*h* into which the first portion 21*g* of the first protruding portion 21*e* positioned on the rear side with respect to the edge 31*c* is fit. In other words, a second portion 21*i* of the first member 3Rr adjacent to the slit 21*h* is positioned on the side opposite to the tip of the first portion 21*g*, and comes into contact with the first portion 21*g*. The first protruding portion 21*e* and the second protruding portion 21*f* having such structures are fitted together in the front-back direction and are integrated, thereby forming the first support 2Fr. The second protruding portion 21*f* has an opening 21*j*, whereas the first protruding portion 21*e* is provided with a connecting portion 21*k* (e.g., a male screw hole) to which a fixture (e.g., a screw, which is not illustrated) that passes through the opening 21*j* is connected. In other words, the first protruding portion 21*e* and the second protruding portion 21*f* are connected with the fixture. A concave portion 21*m* is provided to the edge of the opening 21*j*. A cap 21*n* (refer to FIGS. 3 and 7, for example) is fitted into the concave portion 21*m*, and covers the concave portion 21*m* and the opening 21*j*. The cap 21*n* is made of a material having elasticity and flexibility, such as elastomer.

Figure 8:
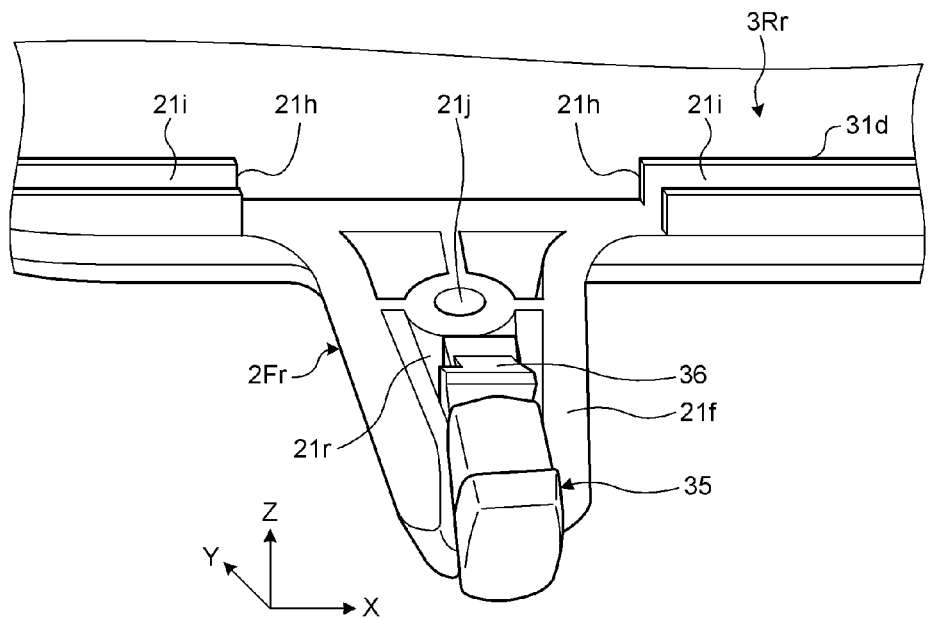
FIG. 8 is an exemplary perspective view of an internal structure of the first support of the television receiver in the embodiment.

In the first embodiment, for example, an elastic member 35 having flexibility and elasticity is sandwiched between the first protruding portion 21*e* and the second protruding portion 21*f* as illustrated in FIGS. 8 and 9. The elastic member 35 is housed in a concave portion 21*p* provided to the first protruding portion 21*e* and a concave portion 21*r* provided to the second protruding portion 21*f*. The elastic member 35 is exposed (protrudes) to the tip side (lower side) of the first support 2Fr. Furthermore, as illustrated in FIG. 8, a buffer member 36 having flexibility is arranged on the based side (upper side) of the elastic member 35. The buffer member 36 is interposed between the elastic member 35 and the first support 2Fr. The elastic member 35 is made of elastomer, for example. The buffer member 36 is made of a foamed material of a synthetic resin material, for example.

Figure 3:
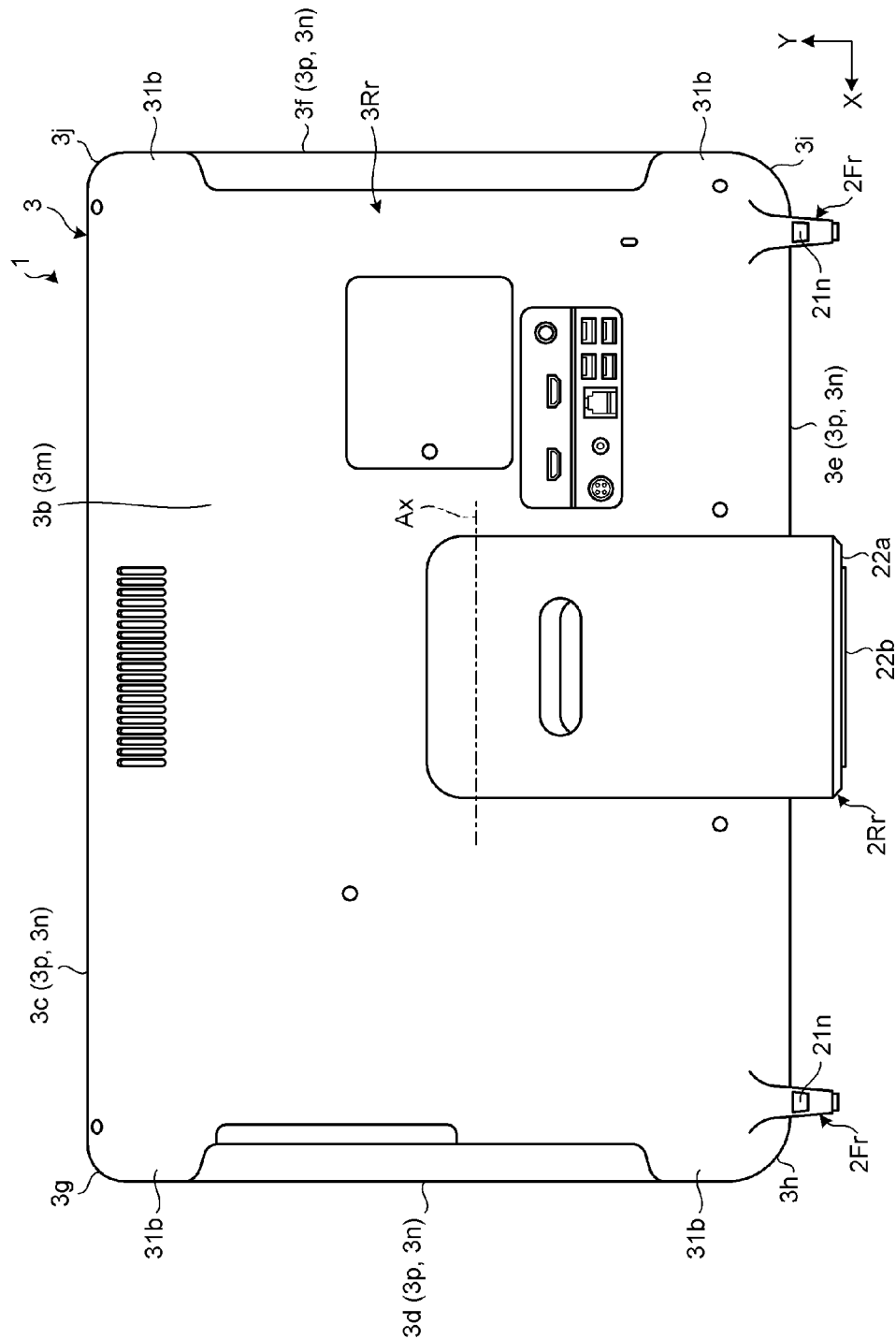
FIG. 3 is an exemplary back view of the television receiver in the embodiment.
Figure 10:
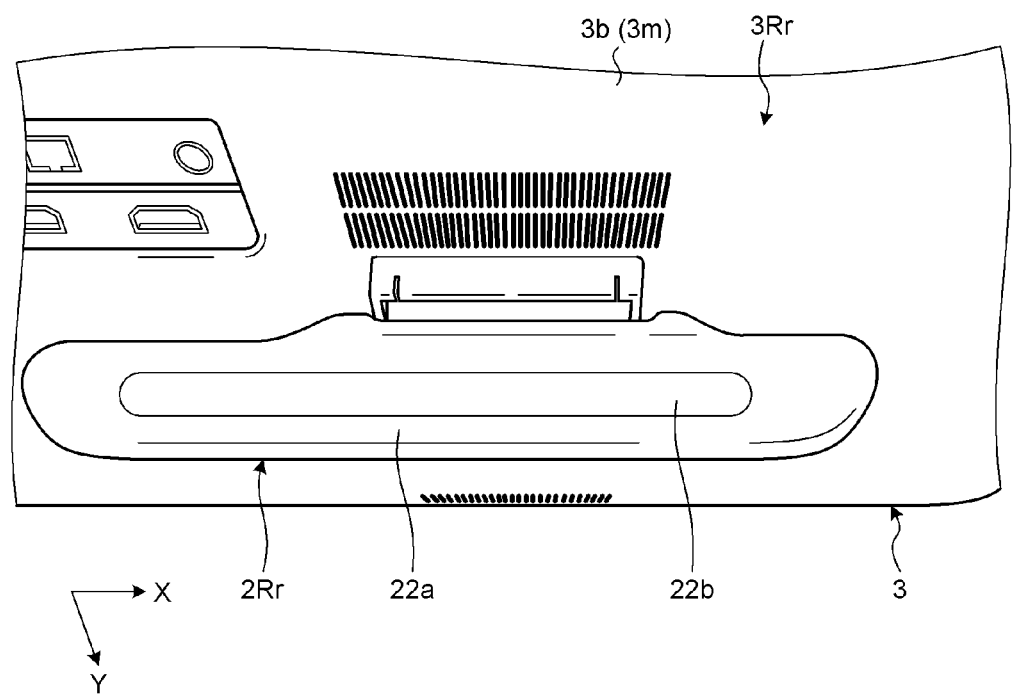
FIG. 10 is an exemplary perspective view of a part including a second support of the television receiver in the embodiment viewed from the back and the bottom.

In the first embodiment, for example, the second support 2Rr has an appearance in a square shape (e.g., a rectangular shape) having the width in the longitudinal direction of the housing 3 (or the display 4) and in a plate shape as illustrated in FIGS. 1, 3, and 10. Furthermore, as illustrated in FIG. 10, an end 22*a* is formed in an elongated plane shape extending along the longitudinal direction of the housing 3 (or the display 4). The end 22*a* is provided with an elastic member 22*b* extending along the longitudinal direction of the end 22*a*. The elastic member 22*b* protrudes toward the tip side (lower side) from the end 22*a*.

In the first embodiment, for example, the second support 2Rr is supported in a rotatable manner by the wall 3*m* of the housing 3 as illustrated in FIGS. 4 and 5. The second support 2Rr is coupled to the wall 3*m* via a hinge mechanism (not illustrated) comprising two components connected in a rotatable manner about a rotation axis (Ax) illustrated in FIGS. 3 to 5. The rotation axis Ax is positioned at the center portion of the wall 3*m* and at an end 22*c* opposite to the end 22*a* of the second support 2Rr, and extends along the end 22*a* (longitudinal direction of the housing 3 and the display 4 or horizontal direction) and the rear surface 3*b* of the wall 3*m*. FIG. 4 illustrates a state in which the second support 2Rr protrudes (an unfolded state). FIG. 5 illustrates a state in which the second support 2Rr recedes (a folded state). As is clear from FIG. 4, if the second support 2Rr is unfolded, and the housing 3 is supported by the first support 2Fr and the second support 2Rr in a standing manner, the first support 2Fr extends from the rear side to the front side while extending from the upper side to the lower side, and the second support 2Rr extends from the front side to the rear side while extending from the upper side to the lower side.

Figure 11:
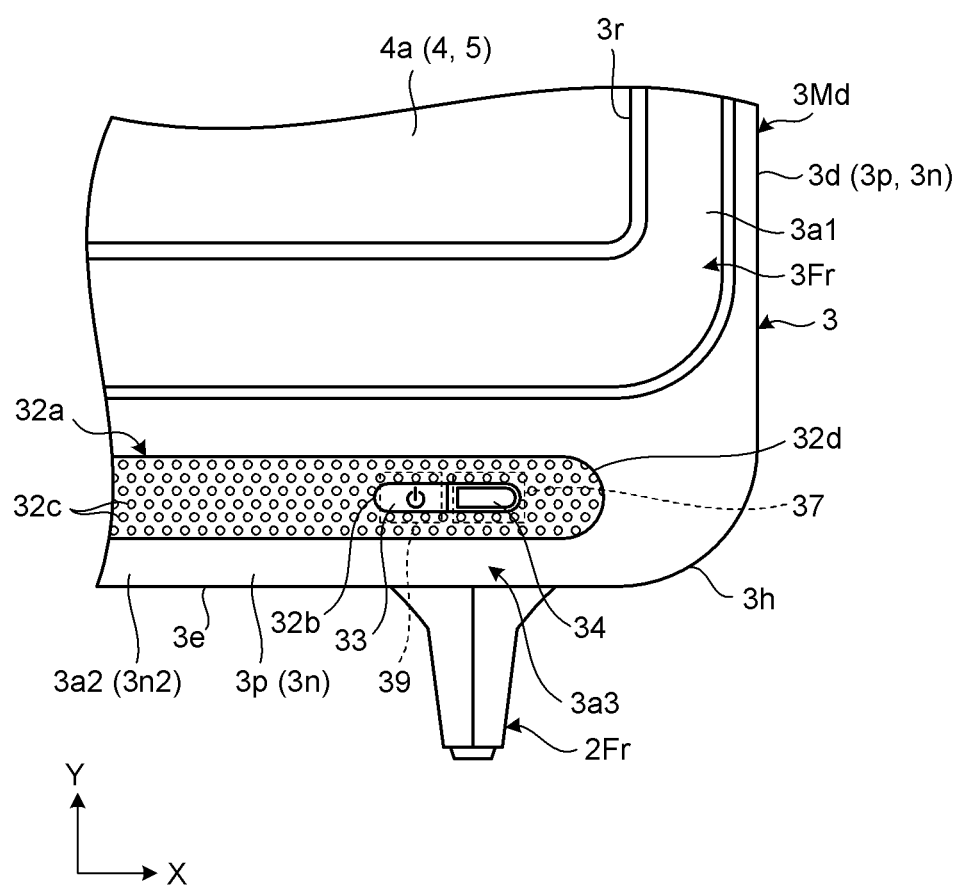
FIG. 11 is an exemplary front view of a part of the television receiver in the embodiment.
Figure 12:
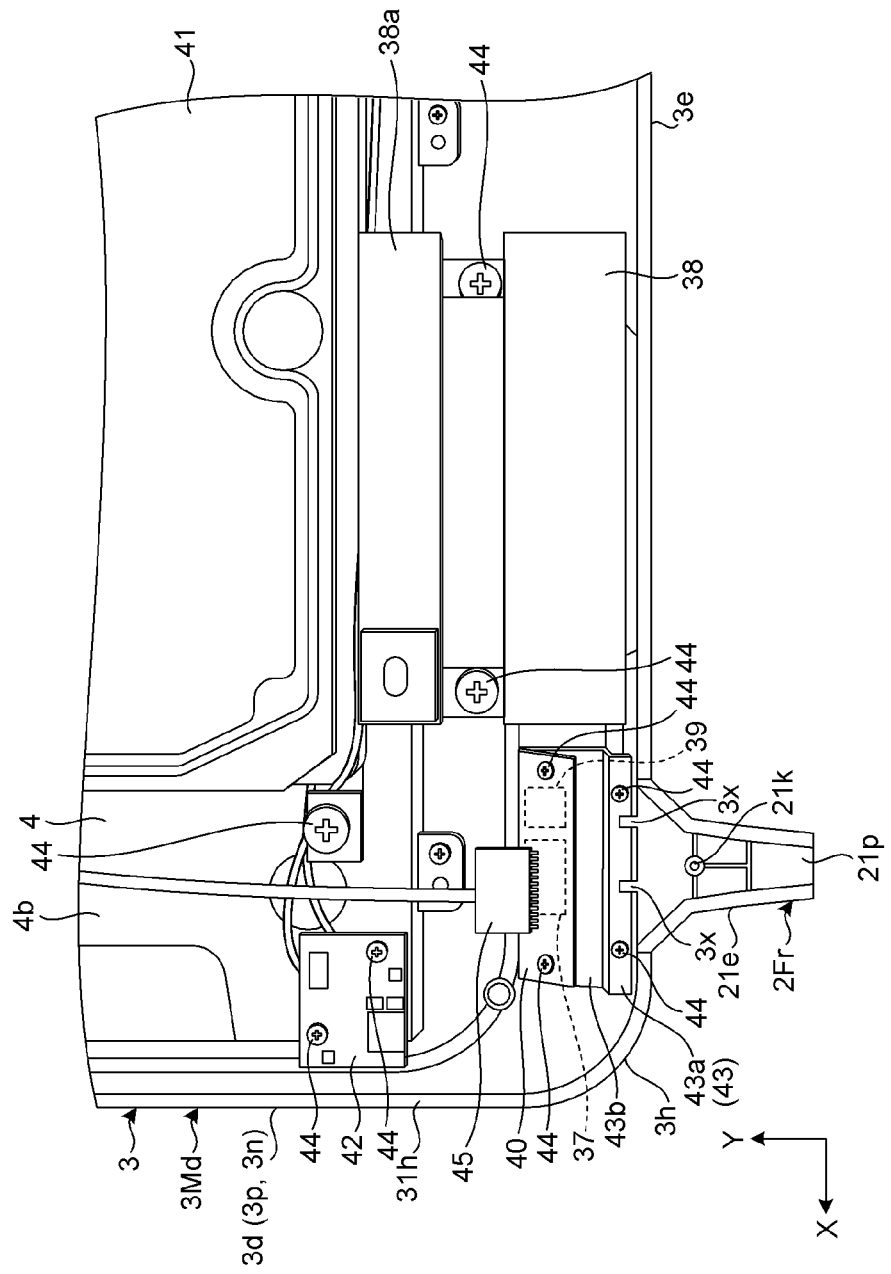
FIG. 12 is an exemplary back view of a part inside of a housing of the television receiver in the embodiment.

As illustrated in FIGS. 1 and 11, the wall 3n2 has openings 32a and 32b. In other words, the front surface 3a2 (inclined surface) of the wall 3n2 has the openings 32a and 32b. The opening 32b is an example of a second opening. Two openings 32a are provided in a manner distant from each other in the longitudinal direction of the screen 4a. The opening 32a has a plurality of small holes 32c (holes or through holes, refer to FIG. 6). A speaker 38 (a housed component, refer to FIG. 12) is provided to the back of the area at which the opening 32a is arranged, and speech (sound) from the speaker 38 is output through the opening 32a (small holes 32c). FIG. 12 illustrates the speaker 38 arranged in a manner corresponding to one of third openings 32a. As described above, the front surface 3a2 has the small holes 32c for outputting sound. The small hole 32c is an example of a third opening. As illustrated in FIG. 1, the openings 32a serving as areas having the small holes 32c are formed in an elongated hole shape extending along the end 3e on the left side and the right side viewed from the front. The length of the opening 32a is approximately one-third of the length of the end 3e. The opening 32b is arranged in the opening 32a serving as the area having the small holes 32c on the front surface 3a (front surface 3a1). Furthermore, the opening 32b is positioned in a manner close to an end 32d in the longitudinal direction of the screen 4a in the opening 32a (area). The opening 32b is positioned in a manner close to the end 3d between the end 3f and the end 3d.

In the first embodiment, for example, an operating element 33 of a switch 39 (a housed component) and a cover 34 of a communication module 37 (e.g., an infrared receiver or a housed component) are exposed through the opening 32b as illustrated in FIGS. 1 and 11. The cover 34 is an example of another component different from the operating element 33. The opening 32b exposes the operating element 33 and the cover 34, which is another component different from the operating element 33. The operating element 33 is an example of an operating module. The switch 39 can be configured as a so-called push-push type push-button switch that switches its ON and OFF every time the operating element 33 is pressed, for example. The operating element 33 is pressed to operate along a direction (a direction of an arrow F illustrated in FIG. 4) nearly vertical to the front surface 3a2. The switch 39 can be configured as a power switch, for example. A mark indicating the fact that the switch 39 is a power switch is provided on (the surface of) the operating element 33, for example. The operating element 33 is not limited to the switch 39, and may be provided to an adjuster that adjusts the brightness of the screen 4a, for example. The communication module 37 can be configured as a light receiver of infrared rays (infrared light), for example. The opening 32b is provided to a portion 3a3 (a first portion, a first area, or an area) positioned on the housing 3 side of one of the first supports 2Fr in the lateral direction of the screen 4a on the front surface 3a (front surface 3a2). In other words, the opening 32b is positioned above one of the first supports 2Fr, whereby the operating element 33 and the cover 34 are also positioned above one of the first supports 2Fr.

The position of the opening 32b is not limited to the position described above. For example, the opening 32b may be provided to the front surface 21a, and the operating element 33 may be exposed through the opening 32b. Alternatively, the opening 32b may be provided to a portion 3a4 positioned on the housing 3 side between the first supports 2Fr in the lateral direction of the screen 4a, and the operating element 33 may be exposed through the opening 32b. Still alternatively, the opening 32b may be positioned between a pair of first supports 2Fr arranged line-symmetrically with respect to a (virtual) center line passing through the center in the longitudinal direction of the screen 4a. In other words, the opening 32b may be positioned eccentrically with respect not to the center line of the first supports 2Fr in the longitudinal direction of the screen 4a, but to the center line of the housing 3 in the longitudinal direction of the screen 4a. As described above, the opening 32b that exposes the operating element 33 may be provided to any one of the portion 3a3 on the front surface 3a, the portion 3a4 positioned on the housing 3 side between the first supports 2Fr in the lateral direction of the screen 4a, and the front surface 21a.

In the first embodiment, for example, the operating element 33 is arranged between one of the first supports 2Fr (e.g., the first support 2Fr on the right side in FIG. 1) and the screen 4a in the lateral direction of the screen 4a as illustrated in FIGS. 1 and 11. In the first embodiment, for example, the operating element 33 is arranged ahead (on the screen 4a side) of the first support 2Fr. In the first embodiment, for example, the operating element 33 is attached to the second member 3Md. The operating element 33 is attached to the second member 3Md via a connecting member together with the switch 39, for example. In the first embodiment, for example, the operating element 33 is arranged at a position closer to the center of the opening 3r (first opening) than the cover 34 (another component) in the longitudinal direction of the screen 4a.

In the first embodiment, for example, the housing 3 houses a board 40 (a circuit board or a housed component) as illustrated in FIG. 12. The switch 39 (e.g., a power switch) provided with the operating element 33 and the communication module 37 are mounted on the front surface (a component side, one side, or a surface) of the board 40. Furthermore, a connector 45 is provided to a rear surface 40a (the other surface or a surface) of the board 40. The board 40 is attached to the second member 3Md via a supporting member 43 (an attaching member, an intervening member, or a sheet metal member). The board 40 (or the front surface and the rear surface 40a thereof) is arranged along the front surface 3a2 (inclined surface), and is inclined with respect to the screen 4a. The board 40 is attached to the second member 3Md with a fixture 44 (a screw), and the supporting member 43 is also attached to the second member 3Md with the fixture 44 (screw), for example. The supporting member 43 comprises a base portion 43a and a plate portion 43b (an attaching portion) extending from the base portion 43a. The board 40 is attached to the plate portion 43b. The plate portion 43b (or a part thereof) is arranged between the second member 3Md and the board 40. The supporting member 43, for example, supports the operating element 33 by an engaging portion (a supporting portion or an arm, which is not illustrated) in a displaceable manner (a reciprocatable manner, a forward-and-rearward movable manner, or an operatable manner). Furthermore, the supporting member 43 engages with an engaging portion (claw) 3x provided to the second member 3Md, for example. The board 40 is arranged behind (on the back surface side of) the opening 32b, and above the first support 2Fr and below the display 4. In other words, the board 40 is arranged between the first support 2Fr and the display 4. The board 40 is arranged side by side with the speaker 38 in the longitudinal direction of the screen 4a. The speaker 38 is attached to the second member 3Md with the fixture 44 (screw). One end 38a (an upper end, an end, or an edge) of the speaker 38 is arranged behind the display 4.

In the housing 3, another board (a circuit board or a housed component, which is not illustrated) different from the board 40 is housed on the rear side of the display 4 (other side, back side, wall 3m side, or side opposite to the screen 4a). The board is provided in a manner overlapping with the display 4. The board is provided in a manner separated from the walls 3k, 3m, 3n, and the like, that is, with a gap interposed between the board and each of the walls 3k, 3m, 3n, and the like. Furthermore, the board is fixed to the display 4 or the housing 3 with a fixture such as a screw. A plurality of electronic components (components or elements, which are not illustrated), such as a central processing unit (CPU), are mounted on the board (circuit board, control board, or main board). The electronic components include a heating element. The electronic component (heating element) that generates a large amount of heat can be provided with a cooling mechanism (a heat releasing module or a heat receiving module, which is not illustrated). The board and the electronic components constitute at least a part of a control circuit (not illustrated). The control circuit can comprise a video signal processing circuit, a tuner, a high-definition multimedia interface (HDMI) signal processor, an audio video (AV) input terminal, a remote-controller signal receiver, a controller, a selector, an on-screen display interface, a storage module (e.g., a read-only memory (ROM), a random access memory (RAM), and a hard disk drive (HDD)), and a speech signal processing circuit, for example. FIG. 12 illustrates an HDD 41 (a housed component) as an example of the storage module. A board 42 (a housed component) provided with a connector (an electrical component) for a dongle is arranged around the HDD 41. The HDD 41 and the board 42 are housed on the rear side of the display 4 (other side, back side, wall 3m side, or side opposite to the screen 4a) in the housing 3. The HDD 41 is arranged above the speaker 38 (on the end 3c side of the housing 3), and the board 42 is arranged above the board 40 (on the end 3c side of the housing 3), for example. The HDD 41 and the board 42 are connected (fixed) to a rear surface 4b of the display 4 with the fixture 44 (screw). The control circuit controls output of video (a moving image, a still image, or the like) by the screen 4a of the display 4, output of speech by the speaker 38, emission of light by a light emitting diode (LED, which is not illustrated), and the like. The display 4, the speaker 38, the LED, and the like are examples of an output module.

As described above, in the first embodiment, for example, the television receiver 1 comprises the two first supports 2Fr comprising the first protruding portion 21e protruding from positions closer to the center portion than the ends 3d and 3f on both ends in the longitudinal direction of the screen 4a on the end 3e of the second member 3Md in the lateral direction of the screen 4a and the second support 2Rr protruding from the first member 3Rr in a manner separated from the two first supports 2Fr. Therefore, according to the first embodiment, for example, the television receiver 1 can be supported by the first supports 2Fr and the second support 2Rr in a smaller area. Accordingly, the configuration described above facilitates placing the television receiver 1 in a smaller space, for example. Furthermore, the configuration described above allows a portion including the first supports 2Fr to look slimmer or smaller than in a configuration in which supports are arranged on both ends in the longitudinal direction, for example.

In the first embodiment, for example, the display 4 is attached to the second member 3Md. Therefore, according to the first embodiment, because the display 4 is attached to the second member 3Md to which the first supports 2Fr are provided, flexure, deformation, and an increase in stress of the housing 3 due to the weight of the display 4 are unlikely to occur compared with the case where the display 4 is attached to another member provided with no support, for example.

In the first embodiment, for example, the second member 3Md comprises the front portion 31a of the wall 3n1 that covers the display 4 on both ends in the longitudinal direction of the screen 4a and that tapers from the end 3e side to the side opposite to the end 3e (end 3c side). Therefore, according to the first embodiment, the wall 3n1 can look slimmer or smaller viewed from the front of the screen 4a, for example.

In the first embodiment, for example, the first protruding portion 21e protrudes in a direction along the edge 31c of the front portion 31a on the side opposite to the screen 4a. Therefore, according to the first embodiment, the first protruding portion 21e and the edge 31c of the second member 3Md are arranged along a plane (a plane along the edge 31c and the first protruding portion 21e), for example. As a result, the first supports 2Fr and the second member 3Md can support the display 4 more firmly than in the case where the first protruding portion 21e and the edge 31c of the second member 3Md are arranged in a manner intersecting with each other, for example. Furthermore, stress concentration is unlikely to occur at a protruding part of the first protruding portion 21e in the second member 3Md, for example. Moreover, because the first protruding portion 21e is likely to be directed to the vicinity of the center of gravity of the display 4, stress occurring in the first protruding portion 21e due to the weight of the display 4 is likely to be reduced, for example.

In the first embodiment, for example, the first member 3Rr comprises the rear portion 31b of the wall 3n1 that covers the display 4 at the ends 3d and 3f on both ends in the longitudinal direction of the screen 4a and that extends toward the center portion viewed from the front of the screen 4a while extending away from the screen 4a. Therefore, according to the first embodiment, an area in which the rear portion 31b can be seen from the front of the screen 4a decreases compared with the case where a rear portion is arranged along a direction orthogonal to the screen 4a, for example. As a result, the wall 3n1 can look slimmer or smaller. Furthermore, if the front portion 31a has a shape that tapers from the end 3e side to the side opposite to the end 3e (end 3c side), for example, the wall 3n1 can look slimmer or smaller as a whole.

In the first embodiment, for example, the first support 2Fr tapers from the base to the tip. Therefore, according to the first embodiment, the portion including the first supports 2Fr can look slimmer or smaller than in a configuration in which the width or the thickness of a support is constant from the base to the tip.

In the first embodiment, for example, the first support 2Fr comprises the second protruding portion 21f protruding from a position closer to the center portion than the ends 3d and 3f on both ends in the longitudinal direction of the screen 4a on the end 3e of the first member 3Rr in the lateral direction of the screen 4a, and the first protruding portion 21e and the second protruding portion 21f are connected. Therefore, according to the first embodiment, the weight of the display 4 can be supported by a larger area of the housing 3, for example. Accordingly, an increase in local stress can be suppressed in the housing 3.

In the first embodiment, for example, the first protruding portion 21e comprises the first portion 21g positioned on the side opposite to the screen 4a with respect to the edge 31c, and the first member 3Rr comprises the second portion 21i that comes into contact with the side opposite to the tip of the first portion 21g. Therefore, according to the first embodiment, load can be transmitted between the first portion 21g and the second portion 21i, that is, between the first protruding portion 21e provided to the second member 3Md and the first member 3Rr, for example. Consequently, according to the first embodiment, the weight of the display 4 can be supported by a larger area of the housing 3, for example. Accordingly, an increase in local stress can be suppressed in the housing 3.

The first protruding portion 21e may be formed integrally with the second member 3Md, or may be formed as a separate component from the second member 3Md to be integrated with the second member 3Md by fixing with a fixture, such as a screw, or welding, for example.

In the first embodiment, for example, the opening 32b (second opening) is provided to the portion 3a3 positioned on the housing 3 side of one of the first supports 2Fr in the lateral direction of the screen 4a on the front surface 3a (front surface 3a2). The operating element 33 is exposed through the opening 32b. Therefore, according to the first embodiment, it is possible to suppress applying rotational force about the first support 2Fr to the housing 3 by an operation (e.g., a pressing operation) performed on the operating element 33 by the operator, for example. Consequently, according to the first embodiment, it is possible to suppress rotation of the housing 3 (television receiver 1) about the first support 2Fr. In other words, according to the first embodiment, it is possible to enhance the stability in placement of the television receiver 1 when the operating element 33 is operated. Also in the case where the opening 32b that exposes the operating element 33 is provided to the portion 3a4 positioned on the housing 3 side between the first supports 2Fr in the lateral direction of the screen 4a on the front surface 3a or to the front surface 21a, it is possible to enhance the stability in placement of the television receiver 1 when the operating element 33 is operated.

In the first embodiment, for example, the front surface 3a includes the front surface 3a2 inclined with respect to the screen 4a, and the opening 32b is provided to the front surface 3a2. Therefore, according to the first embodiment, because the front surface 3a includes the front surface 3a2 inclined with respect to the screen 4a, the housing 3 can look smaller in apparent size to the operator, for example. Furthermore, according to the first embodiment, the opening 32b is provided to the front surface 3a2, whereby a direction of the pressing operation performed on the operating element 33 exposed through the opening 32b is a direction rearward and obliquely upward, for example. As a result, because the pressing force is separated into upward component force and rearward component force, the force to press the housing 3 rearward is only a part of the pressing force. By making the force to press the housing 3 rearward relatively small in this manner, it is possible to suppress rotation of the housing 3 about the first support 2Fr. Moreover, according to the first embodiment, by providing the opening 32b that exposes the operating element 33 to the front surface 3a2, it is possible to make the opening 32b and the operating element 33 less conspicuous than the screen 4a, for example. In addition, by arranging the speaker 38 and the switch 39 behind the front surface 3a2, the speaker 38 and the switch 39 can be made inconspicuous.

In the first embodiment, for example, the opening 32b is provided to the front surface 3a, and the operating element 33 is arranged ahead of the first support 2Fr, for example. Therefore, according to the first embodiment, because the pressing force applied to the operating element 33 is transmitted to the first support 2Fr properly, it is possible to further enhance the stability in placement of the television receiver 1 when the operating element 33 is operated, for example.

In the first embodiment, for example, the operating element 33 is attached to the second member 3Md, and the first support 2Fr comprises the first protruding portion 21e as a protruding portion protruding from the second member 3Md. Therefore, according to the first embodiment, because the operating element 33 is attached to the second member 3Md, it is possible to suppress transmission of the operating force applied to the operating element 33 to the screen 4a compared with the case where the operating element 33 is attached to the third member 3Fr, for example.

In the first embodiment, for example, the opening 32b exposes the operating element 33 and the cover 34 serving as another member different from the operating element 33. Therefore, according to the first embodiment, because a single opening 32b exposes a plurality of components, the configuration of the television receiver 1 can be made relatively simple, for example.

In the first embodiment, for example, the front surface 3a has the small holes 32c through which sound is output, and the opening 32b is arranged in the opening 32a (area) provided with the small holes 32c on the front surface 3a. Therefore, according to the first embodiment, the opening 32b is made inconspicuous, for example.

In the first embodiment, for example, the opening 32b is arranged in a manner close to the end 32d in the longitudinal direction of the screen 4a in the opening 32a (area). Therefore, according to the first embodiment, the configuration facilitates arranging the switch 39 provided with the operating element 33 and the speaker 38 side by side.

In the first embodiment, for example, the operating element 33 is arranged between one of the first support 2Fr and the screen 4a in the lateral direction of the screen 4a. Therefore, according to the first embodiment, it is possible to suppress rotation of the housing 3 about the first support 2Fr caused by an operation performed on the operating element 33, for example.

In the first embodiment, for example, the boundary line 31i between the first member 3Rr and the second member 3Md is positioned in the groove 31e. Therefore, according to the first embodiment, the boundary line 31i can be made inconspicuous, for example.

In the first embodiment, for example, the operating element 33 and the cover 34 are arranged side by side in the longitudinal direction (horizontal direction) of the screen 4a. Therefore, in the first embodiment, the position of the center of gravity of the television receiver 1 can be made closer to the end 3e (lower end) side than in a configuration in which an operating element and a cover are arranged side by side in the lateral direction (vertical direction) of the screen 4a, for example. Consequently, according to the first embodiment, it is possible to further enhance the stability in placement of the television receiver 1. Furthermore, in the first embodiment, for example, the switch 39 and the communication module 37 are arranged side by side in the longitudinal direction (horizontal direction) of the screen 4a. Therefore, in the first embodiment, the position of the center of gravity of the television receiver 1 can be made closer to the end 3e (lower end) side than in a configuration in which a switch and a communication module are arranged side by side in the lateral direction (vertical direction) of the screen 4a, for example. Consequently, according to the first embodiment, it is possible to further enhance the stability in placement of the television receiver 1.

In the first embodiment, for example, the operating element 33, the cover 34, the switch 39, and the communication module 37 are arranged above the first support 2Fr. Therefore, according to the first embodiment, load due to the weight of the operating element 33, the cover 34, the switch 39, and the communication module 37 is applied to the first support 2Fr from above, flexure in the housing 3 can be suppressed, for example.

First Modification

Figure 13:
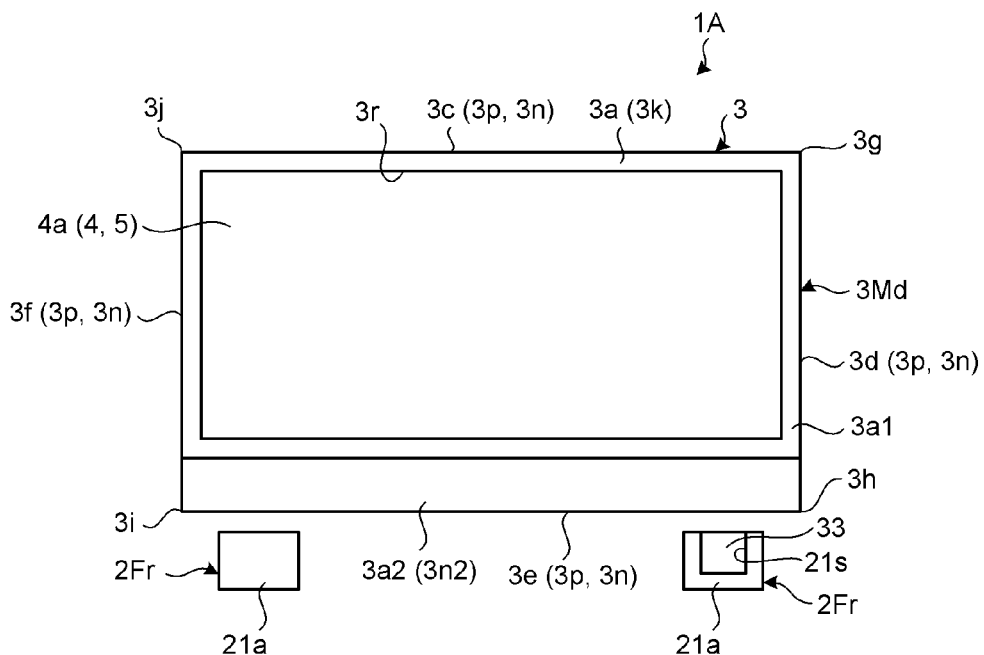
FIG. 13 is an exemplary front view schematically illustrating a television receiver according to a first modification.

FIG. 13 illustrates a television receiver 1A according to a first modification. FIG. 13 illustrates a state in which a first support 2Fr is removed from the housing 3. In the television receiver 1A according to the first modification, two first supports 2Fr are provided to the housing 3 in a detachable manner. The first supports 2Fr are provided to the housing 3 in a detachable manner by a detaching structure (a connecting structure or an engaging structure, which is not illustrated). The detaching structure may include an engaging portion and a screwing structure, for example.

Furthermore, in the television receiver 1A according to the first modification, one of the first supports 2Fr is provided with the opening 21s and the operating element 33. The opening 21s is provided to the front surface 21a of the first support 2Fr. The opening 21s is an example of the second opening. The operating element 33 is exposed through the opening 21s.

Second Modification

Figure 14:
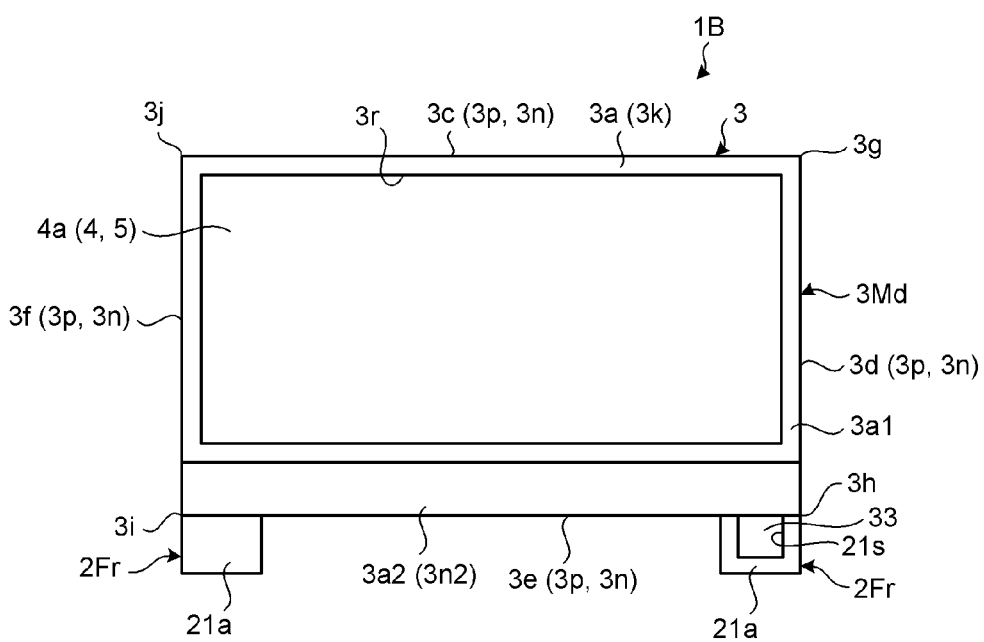
FIG. 14 is an exemplary front view schematically illustrating a television receiver according to a second modification.

FIG. 14 illustrates a television receiver 1B according to a second modification. In the television receiver 1B according to the second modification, two first supports 2Fr protrude downward (toward the side opposite to an end 3c) from both ends (corners 3h and 3i) in the longitudinal direction (X direction, longitudinal direction of the screen 4a, or horizontal direction) of the end 3e (one end, a long side portion, or a lower side portion) in the lateral direction (Y direction or lateral direction of the screen 4a) of the housing 3. In other words, the two first supports 2Fr are positioned on an extension of the extending surface 3p (a side surface) on ends 3d and 3f.

Furthermore, in the television receiver 1B according to the second modification, one of the first supports 2Fr is provided with the opening 21s and the operating element 33. The opening 21s and the operating element 33 have the same configuration as that in the first modification.

Third Modification

Figure 15:
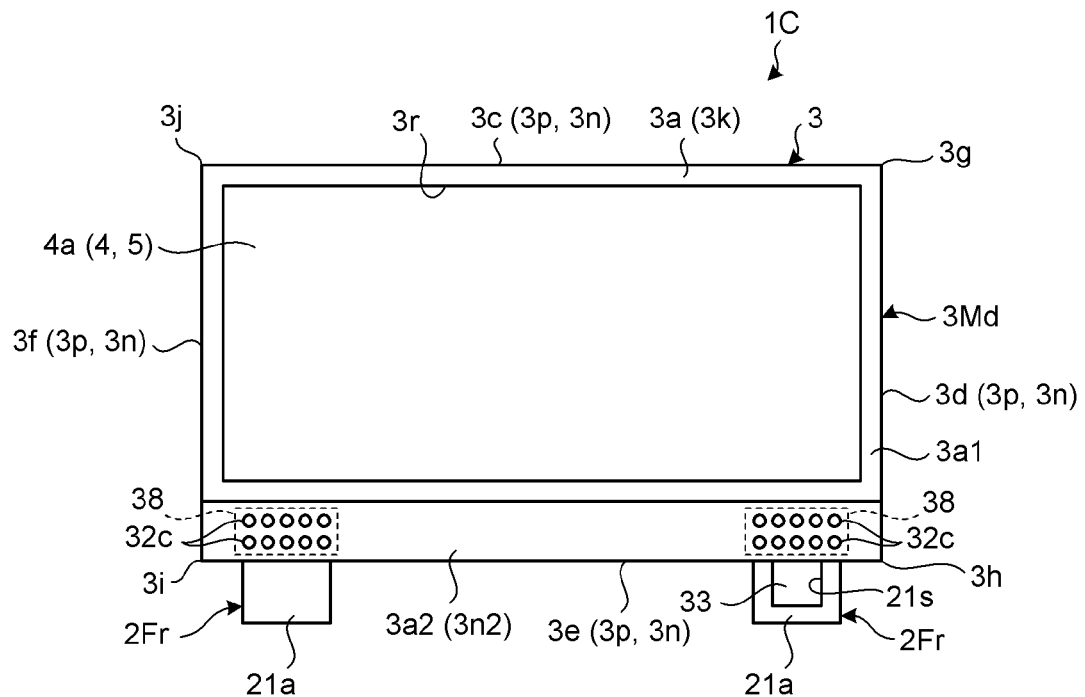
FIG. 15 is an exemplary front view schematically illustrating a television receiver according to a third modification.

FIG. 15 illustrates a television receiver 1C according to a third modification. In the television receiver 1C according to the third modification, the speaker 38 is arranged above a first support 2Fr (on the screen 4a side), and is housed in the housing 3. This configuration can suppress vibration of the speaker 38.

Furthermore, in the television receiver 1C according to the third modification, one of the first supports 2Fr is provided with the opening 21s and the operating element 33. The opening 21s and the operating element 33 have the same configuration as that in the first modification.

Fourth Modification

Figure 16:
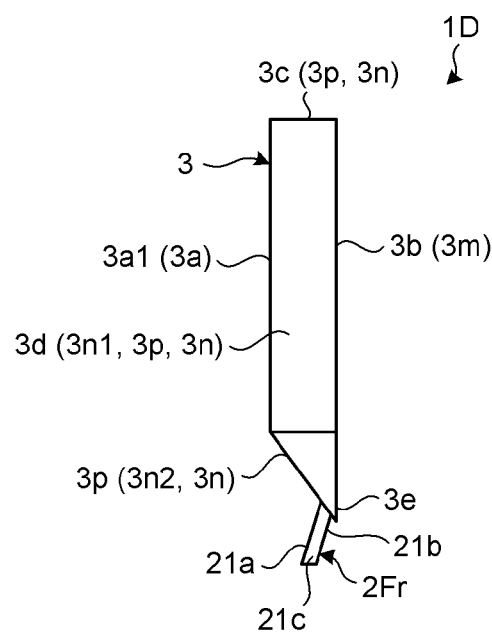
FIG. 16 is an exemplary front view schematically illustrating a television receiver according to a fourth modification.

FIG. 16 illustrates a television receiver 1D according to a fourth modification. In the television receiver 1D according to the fourth modification, a first support 2Fr extends forward (toward the front side, toward the screen 4a side, or toward the left side in FIG. 16) while extending from the base (the housing 3 side) to the tip. The first support 2Fr is inclined with respect to a direction along the screen 4a and a normal direction of the screen 4a.

Fifth Modification

Figure 17:
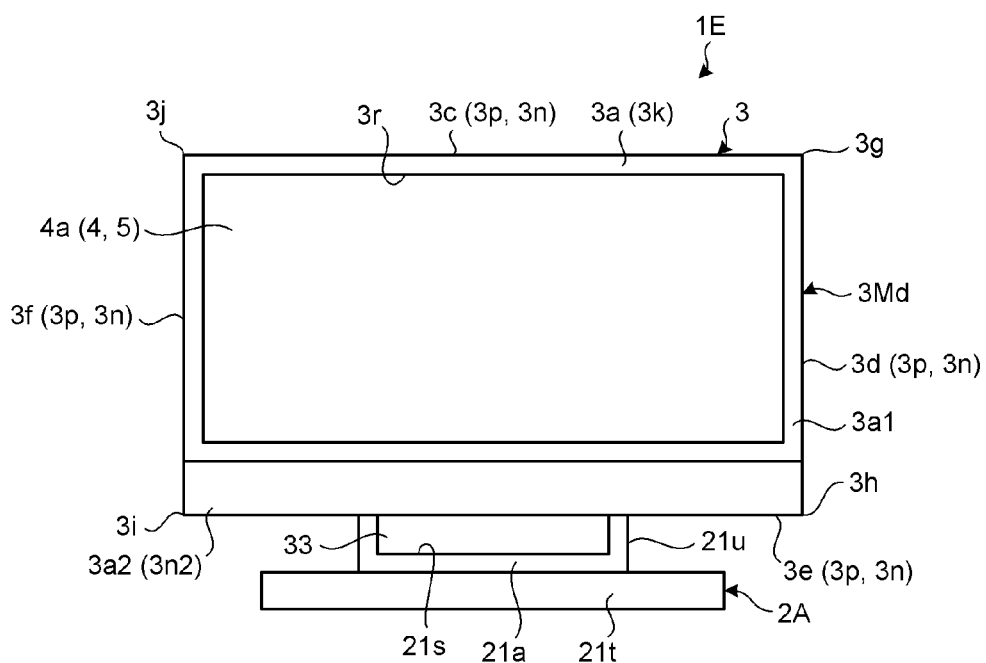
FIG. 17 is an exemplary front view schematically illustrating a television receiver according to a fifth modification.

FIG. 17 illustrates a television receiver 1E according to a fifth modification. In the television receiver 1E according to the fifth modification, one support 2A alone is provided instead of a first support 2Fr and the second support 2Rr. The support 2A supports the housing 3. The support 2A comprises a grounded portion 21t (a part) and a standing portion 21u (a part). The standing portion 21u extends from the grounded portion 21t to the housing 3. The housing 3 is connected to an upper end (an end) of the standing portion 21u. The support 2A supports the housing 3 in a rotatable (swingable) manner. The support 2A changes the angle of the screen 4a in the vertical direction, for example. In other words, the support 2A can adjust a tilt. The support 2A can support the housing 3 rotatably in another direction (e.g., pivot and swivel).

Furthermore, in the television receiver 1E according to the fifth modification, the standing portion 21u of the support 2A is provided with the opening 21s and the operating element 33. The opening 21s is provided to the front surface 21a of the standing portion 21u of the support 2A. The operating element 33 is exposed through the opening 21s. The opening 21s and the operating element 33 may be provided to the grounded portion 21t.

Sixth Modification

Figure 18:
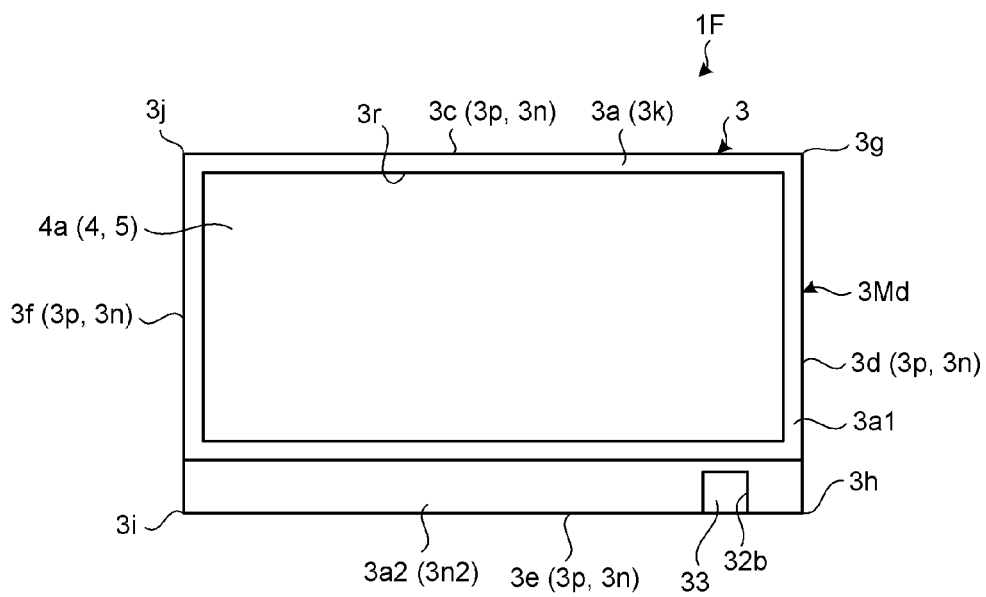
FIG. 18 is an exemplary front view schematically illustrating a television receiver according to a sixth modification.

FIG. 18 illustrates a television receiver 1F according to a sixth modification. In the television receiver 1F according to the sixth modification, no first support 2Fr or second support 2Rr is provided, and the end 3e of the housing 3 functions as a support. In other words, the support (end 3e) is formed integrally with the housing 3. The end 3e of the housing 3 is placed on a placing section, and supports the housing 3. Furthermore, in the sixth modification, the opening 32b is provided to the front surface 3a2 of the wall 3n2, and the operating element 33 and a speaker (not illustrated) are provided to the wall 3n2.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented byway of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A television receiver comprising:
a display comprising a screen;
a cover configured to cover at least a side opposite to the screen of the display;
a mask configured to cover a periphery of the screen from a side opposite to the cover;
a middle frame configured to have higher rigidity than that of the mask and have a larger outer edge than that of the mask, and to be positioned between the mask and the cover to cover at least a peripheral edge of the display, and comprising a housed component;
two first supports each comprising a first protruding portion, the first protruding portion configured to be provided integrally with the middle frame, and the first protruding portion is closer to a center portion than a longitudinal end of the screen to the center portion; and
a second support configured to protrude from the cover and separate from the two first supports.

2. The television receiver of claim 1, wherein the display is configured to be attached to the middle frame.

3. The television receiver of claim 1, wherein the middle frame comprises walls on the longitudinal ends of the screen, the walls configured to cover the display and to taper from a first lateral end to a second lateral end.

4. The television receiver of claim 3, wherein the first protruding portions are configured to protrude toward a side opposite to the screen.

5. The television receiver of claim 1, wherein the cover comprises second walls on the longitudinal sides, the second walls configured to cover the display and to extend toward a center portion viewed from a front of the screen while extending away from the screen.

6. The television receiver of claim 1, wherein each of the two first supports is configured to taper from a base to a tip of the each of the two first supports.

7. The television receiver of claim 1, wherein
the two first supports each comprises a second protruding portion on the cover, the second protruding portion configured to be closer to the center portion than the longitudinal end to the center portion, and
the first protruding portion and the second protruding portion are configured to be connected.

8. The television receiver of claim 7, wherein
the middle frame comprises walls on longitudinal ends of the screen,
the first protruding portion comprises a first portion, the first portion configured to be on a side opposite to the screen, and
the cover comprises a second portion configured to come into contact with a side of the first portion opposite to a tip of the first portion.

9. An electronic apparatus comprising:
a display comprising a screen;
a first member configured to cover at least a side opposite to the screen of the display;
a second member configured to be closer to the screen than the first member and to cover at least a peripheral edge of the display; and
supports each comprising a protruding portion, the protruding portion closer to a center portion than a longitudinal end of the screen to the center portion.

* * * * *